US011018221B2

(12) United States Patent
Wong et al.

(10) Patent No.: US 11,018,221 B2

(45) Date of Patent: May 25, 2021

(54) AIR GAP REGIONS OF A SEMICONDUCTOR DEVICE

(71) Applicant: GLOBALFOUNDRIES U.S. INC., Santa Clara, CA (US)

(72) Inventors: Chun Yu Wong, Clifton Park, NY (US); Haiting Wang, Clifton Park, NY (US); Yong Jun Shi, Clifton Park, NY (US); Xiaoming Yang, Ballston Lake, NY (US); Liu Jiang, Clifton Park, NY (US)

(73) Assignee: GLOBALFOUNDRIES U.S. Inc., Santa Clara, CA (US)

( * ) Notice: Subject to any disclaimer, the term of this patent is extended or adjusted under 35 U.S.C. 154(b) by 0 days.

(21) Appl. No.: 16/538,785

(22) Filed: Aug. 12, 2019

(65) Prior Publication Data

US 2021/0050412 A1 Feb. 18, 2021

(51) Int. Cl.

| | |
|---|---|
| ***H01L 29/06*** | (2006.01) |
| ***H01L 23/66*** | (2006.01) |
| ***H01L 21/768*** | (2006.01) |
| ***H01L 21/764*** | (2006.01) |

(52) U.S. Cl.

CPC ........ *H01L 29/0649* (2013.01); *H01L 21/764* (2013.01); *H01L 21/7682* (2013.01); *H01L 21/76816* (2013.01); *H01L 21/76843* (2013.01); *H01L 23/66* (2013.01)

(58) Field of Classification Search

None

See application file for complete search history.

(56) References Cited

U.S. PATENT DOCUMENTS

| | | | | |
|---|---|---|---|---|
| 5,736,446 | A | 4/1998 | Wu | |
| 9,716,158 | B1 | 7/2017 | Cheng et al. | |
| 2013/0248950 | A1* | 9/2013 | Kang | H01L 29/6656 257/288 |
| 2015/0243544 | A1* | 8/2015 | Alptekin | H01L 29/6653 438/586 |
| 2018/0122919 | A1 | 5/2018 | Park et al. | |
| 2020/0135591 | A1* | 4/2020 | Yeong | H01L 29/7851 |

* cited by examiner

*Primary Examiner* — Jae Lee

(74) *Attorney, Agent, or Firm* — David Cain

(57) ABSTRACT

A semiconductor device is provided, which includes an active region, a first structure, a second gate structure, a first gate dielectric sidewall, a second gate dielectric sidewall, a first air gap region, a second air gap region and a contact structure. The active region is formed over a substrate. The first and second gate structures are formed over the active region and between the first gate structure and the second gate structure are the first gate dielectric sidewall, the first air gap region, the contact structure, the second air gap region and a second gate dielectric sidewall.

12 Claims, 6 Drawing Sheets

AIR GAP REGIONS OF A SEMICONDUCTOR DEVICE

FIELD OF THE INVENTION

The disclosed subject matter relates generally to semiconductor devices, and more particularly to a semiconductor device having air gap regions and a method of forming the same.

BACKGROUND

There is an increasing demand for radio frequency (RF) semiconductor devices from industries, such as telecommunications, radar systems and computer networks, to provide reliable and high speed connectivity. The typical operating frequency of RF semiconductor devices ranges from 3 kHz to 300 GHz. In particular, there is great interest from the telecommunication industry to provide reliable high data rate transmission in the millimeter-wave (mmWave) band of the RF spectrum; the mmWave band having a frequency range from 30 GHz to 300 GHz. Semiconductor devices utilizing the mmWave bands are capable of supporting extremely high wireless data rate transmission, enabling exponential increases in speed and significant decreases in latency for mobile communications.

RF semiconductor devices, specifically the field effect transistor (FET) devices, are required to handle high to extremely high-frequency applications, such as high speed switching of high power RF signals. Presence of parasitic components in RF FET devices, such as parasitic inductance, capacitance and resistance, may combine to attenuate and degrade the performances of the RF FET devices considerably. It is critical to ensure the parasitic components are kept low, or at least at an acceptable level for a specific application. Notably, for mmWave applications, the associated parasitic components in the semiconductor device are more significant due to its extremely high operating frequency.

One of the possible solutions to reducing parasitic capacitance in RF FET devices is to fabricate contact structures positioned away from gate structures, i.e., placing the contact structures in a region of wide gate pitch, e.g. 1.5×CPP or greater. As described below, improvements can be made to further reduce parasitic components in semiconductor devices, and a semiconductor device having air gap regions and a method of forming the same are presented.

SUMMARY

According to an aspect of the disclosure, a semiconductor device is provided, which includes an active region, a first structure, a second gate structure, a first gate dielectric sidewall, a second gate dielectric sidewall, a first air gap region, a second air gap region and a contact structure. The active region is formed over a substrate. The first and second gate structures are formed over the active region and between the first gate structure and the second gate structure are the first gate dielectric sidewall, the first air gap region, the contact structure, the second air gap region and a second gate dielectric sidewall.

According to another aspect of the disclosure, a semiconductor device is provided, which includes an active region over a substrate, an array of first gate structures and an array of second gate structures, a plurality of semiconductor structures, a contact structure, a first air gap region and a second air gap region. The array of first gate structures has a first gate pitch and the array of second gate structures has a second gate pitch such that the second gate pitch is wider than the first gate pitch. The array of second gate structures has a first gate and a second gate. The plurality of semiconductor structures is in the active region, wherein each semiconductor structure is positioned adjacent to the gate structures of the first and second arrays. The first gate having first gate dielectric sidewalls and the second gate having second gate dielectric sidewalls. The contact structure is formed over the semiconductor structure between the first and second gates. The first and second air gap regions are formed adjacent to laterally opposite sides of the contact structure.

According to yet another embodiment of the disclosure, a method of forming a semiconductor device is provided, which includes providing an active region over a substrate and forming a first gate structure and a second gate structure traversing across the active region. An semiconductor structure is formed in the active region between the first and second gate structures. A first dielectric layer is deposited over the semiconductor structure between the first and second gate structures. A contact structure is formed in the first dielectric layer over the semiconductor structure. A first trench and a second trench are formed in the first dielectric layer, such that the first trench is between the contact structure and the first gate structure and the second trench is between the contact structure and the second gate structure. A second dielectric layer is deposited over the first and second trenches such that the second dielectric layer seals the first trench to form a first air gap region and seals the second trench to form a second air gap region.

BRIEF DESCRIPTION OF THE DRAWINGS

The embodiments of the present disclosure will be better understood from a reading of the following detailed description, taken in conjunction with the accompanying drawings.

Figure 1:
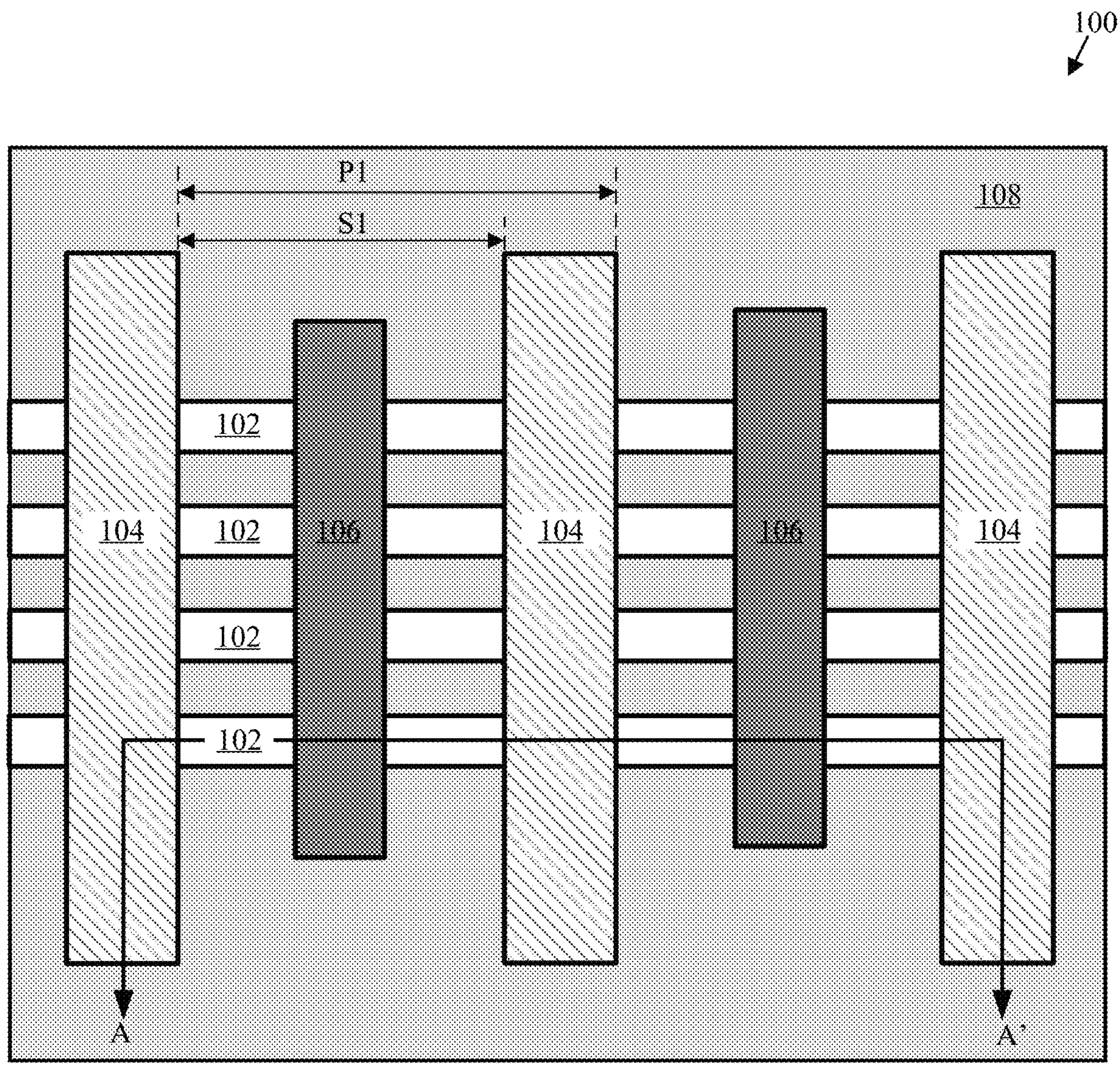
FIG. 1 is a simplified top view of a semiconductor device, according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the disclosure. Additionally, elements in the drawings are not necessarily drawn to scale. For example, the dimensions of some of the elements in the drawings may be exaggerated relative to other elements to help improve understanding of embodiments of the disclosure. The same reference numerals in different drawings denote the same elements, while similar reference numerals may, but do not necessarily, denote similar elements.

DETAILED DESCRIPTION

Various embodiments of the disclosure are described below. The embodiments disclosed herein are exemplary and not intended to be exhaustive or limiting to the disclosure.

The present disclosure relates to a semiconductor device having air gap regions and a method of forming the air gap regions. The semiconductor device may be complementary metal-oxide-semiconductor (CMOS) devices, including P-type metal-oxide-semiconductor (PMOS) devices and/or N-type metal-oxide-semiconductor (NMOS) devices. It is understood that the following disclosure is not limited to any particular type of semiconductor devices. The method disclosed herein may be applied to any type of semiconductor devices, such as tri-gate field effect transistor (FET) devices, fin-type FET (FinFET) devices or planar-type metal-oxide-semiconductor FET (MOSFET) devices.

The semiconductor device may be fabricated with a gate-first, a gate-last or a hybrid fabrication process. In a gate-first process, gate conductive layers are formed over active regions and patterned to form gate structures. These process steps are followed by conventional CMOS processing, including formation of source and drain regions, formation of gate spacers and deposition of inter-level dielectric (ILD) material. In a gate-last process, dummy gate structures are formed followed by conventional CMOS processing including formation of the source and drain regions, formation of gate spacers and deposition of ILD material. Thereafter, the dummy gate structures are removed followed by conventional formation of replacement gate structures. In the hybrid fabrication process, a gate structure of one type of device may be formed first and a gate structure of another type of device may be formed last.

Aspects of the disclosure are now described in detail with accompanying drawings. It is noted that like and corresponding elements are referred to by the use of the same reference numerals. However, it is noted that specific elements may be denoted by a reference numeral and a subscript, for example 212*a*, 212*b*, etc. When those elements are referred to generically, merely the reference numerals are used, for example 212, etc.

FIG. 1 is a simplified top view of a semiconductor device 100, according to an embodiment of the disclosure. The semiconductor device 100 includes an array of active regions 102, an array of gate structures 104 and an array of contact structures 106. The array of active regions 102 is interposed between an insulative layer 108, i.e., the insulative layer 108 isolates the active regions 102 from adjacent active regions 102. The array of gate structures 104 and the array of contact structures 106 are formed traversing across the array of active regions 102, each contact structure 106 is positioned between two gate structures 104. The array of gate structures 104 is separated by a gate pitch P1 with a corresponding gate-to-gate spacing S1 between adjacent gate structures 104.

The term "gate pitch" as used herein defines a distance from a left edge of a gate structure to a left edge of an adjacent gate structure. The minimum gate pitch in a semiconductor device is termed "contacted poly pitch" (CPP), with a corresponding minimum gate-to-gate spacing. The term "gate spacing" as used herein defines a distance between two adjacent gate structures.

In this embodiment, the gate pitch P1 is preferably having a width wider than the minimum gate pitch of 1×CPP of the semiconductor device 100. For example, the gate pitch P1 may have a width of 1.5×CPP, 2×CPP or greater. Advantageously, in a wide gate pitch region, the contact structures 106 can be positioned further apart from the adjacent gate structures 104, thereby lowering the associated parasitic capacitance between the contact structures 106 and the gate structures 104. The term "wide gate pitch" as used herein defines a gate pitch wider than the minimum gate pitch of 1×CPP of the semiconductor device, i.e., a gate pitch of 1.5×CPP, 2×CPP or greater. It is understood that there are other arrays of gate structures having the minimum gate pitch of 1×CPP formed on different regions of the semiconductor device, although those gate structures are not shown in the accompanying drawings.

Those skilled in the art would recognize that the number and placement locations of the active regions 102 and the gate structures 104 may vary according to specific designs of the semiconductor devices. Furthermore, while the active regions 102 are represented as fins in the accompanying drawings, it is also understood that the fin is used only as a non-limiting example of the active region, and other active regions (e.g., a doped layer on a top surface of a bulk semiconductor substrate or a semiconductor-on-insulator layer) may be used as well.

FIGS. 2A-2E are cross-sectional views of a partially processed semiconductor device 200 (taken along a similar line A-A' indicated in FIG. 1), illustrating a method of forming a semiconductor device having air gap regions, according to an embodiment of the disclosure.

Figure 2A:
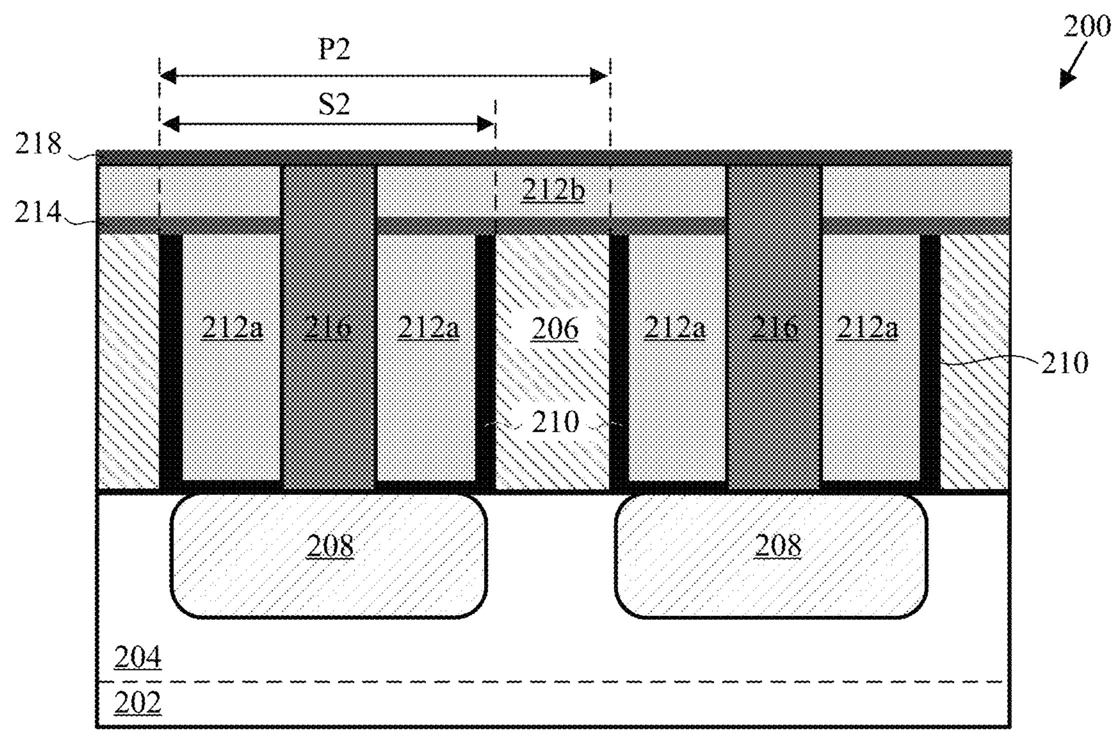
FIGS. 2A-2E are cross-sectional views of a partially processed semiconductor device (taken along a line A-A' as indicated in FIG. 1), illustrating a method of forming a semiconductor device having air gap regions, according to an embodiment of the disclosure.

As illustrated in FIG. 2A, the semiconductor device 200 includes a semiconductor substrate 202 and an active region 204 extending upwards from the semiconductor substrate 202 (an arbitrary intersection between the substrate 202 and the active region 204 as demarcated by a dashed line). The semiconductor substrate 202 may include of any suitable semiconductor material, such as silicon, silicon germanium, silicon carbon, other II-VI or III-V semiconductor compounds and the like. In one embodiment of the disclosure, the semiconductor material of the substrate 202 is preferably silicon.

Gate structures 206 are formed traversing across over the active region 204, as similarly shown for device 100 illustrated in FIG. 1. The gate structures 206 are separated by a gate pitch P2 with a corresponding gate-to-gate spacing S2 between the adjacent gate structures 206. The gate structures 206 typically includes one or more gate dielectric layers (e.g., silicon dioxide, hafnium oxide, titanium oxide or other suitable high-k dielectric material having a dielectric constant of typically 10 or greater) and one or more gate conductive layers (e.g., hafnium, titanium, ruthenium, polysilicon or other suitable conductive materials). The gate conductive layers are capable of modifying the work function property of a gate electrode of the gate structures 206. The gate dielectric layers and the gate conductive layers are not separately shown in the accompanying drawings.

Each of the gate structure 206 may be positioned between a pair of semiconductor structures 208. The semiconductor structures 208 form source and drain regions for the semiconductor device 200. The semiconductor structures 208 may include silicon, silicon phosphorous, silicon phosphorous carbide, germanium, gallium arsenide, gallium nitride, aluminum gallium indium phosphide, and/or other suitable combinations. In one embodiment of the disclosure where an NMOS device is desired, the semiconductor structures 208 may include epitaxially-grown silicon phosphorus. In another embodiment of the disclosure, where a PMOS device is desired, the semiconductor structures 208 may include epitaxially-grown silicon germanium.

A dielectric liner 210 is disposed over sidewalls of the gate structures 206 and over top surfaces of the semiconductor structures 208. The dielectric liner 210 may be formed of a suitable dielectric material, such as silicon nitride, silicon oxide or any suitable low-k dielectric material to at least contribute to electrically isolate the gate structures 206 and the semiconductor structures 208 from adjacent conductive structures. The dielectric liner 210 over the sidewalls of the gate structures 206 form gate spacers for the gate structures 206.

An inter-level dielectric (ILD) layer 212 has a first portion 212_a_ and a second portion 212_b_. The first portion of the ILD layer 212_a_ is disposed between the gate structures 206. A dielectric layer 214 is disposed over the first portion of the ILD layer 212_a_ and the gate structures 206. The second portion of the ILD layer 212_b_ is disposed over the dielectric layer 214. The ILD layer 212 is preferably a dielectric material, such as silicon dioxide, suitable to electrically isolate conductive structures ultimately formed therein while maintaining a robust structure during subsequent processing steps. In one embodiment of the disclosure, the dielectric layer 214 is a gate capping layer preferably formed of silicon nitride having any suitable thickness.

Contact structures 216 are formed in the ILD layer 212, positioned between the gate structures 206. In this embodiment of the disclosure, as the contact structures 216 are positioned in a wide gate pitch region, it is feasible and desirable for the contact structures to have wider widths than those contact structures positioned in a 1×CPP gate pitch region. Contact structures having wider widths will gain the beneficial effect of decreased electrical resistance in the contact structures.

The contact structures 216 are connected to the semiconductor structures 208 to establish an electrical connection between the semiconductor structures 208 and other regions of the semiconductor device 200, e.g., back-end-of-line (BEOL) region of the semiconductor device 200. The BEOL region typically includes a plurality of conductive lines and interconnect vias that are routed as needed across the semiconductor device 200.

Although not shown in FIG. 2A, the contact structures 216 may include one or more liners. For instance, the contact structure 216 may include an adhesion liner and/or a barrier liner. The adhesion liner may include metal silicides, such as titanium silicide, nickel silicide or other suitable adhesion material having any suitable thickness. The barrier liner may include metal nitrides, such as titanium nitride, tantalum nitride or other suitable barrier material having any suitable thickness.

In this embodiment of the disclosure, with the semiconductor device 200 having gates structures that are equally spaced apart, the contact structures 216 are preferably positioned equidistant from the adjacent gate structures 206 to establish a distance as far apart as possible between the contact structures 216 and the adjacent gate structures 206. In accordance with the present disclosure, positioning the contact structures 216 as far apart as possible from the adjacent gate structures 206 minimizes the associated parasitic capacitance between the contact structures 216 and the adjacent gate structures 206, which is especially desirable for RF applications. Decreased parasitic capacitance increases switching speed and lower signal losses of high power RF signals when the semiconductor device is operating at a high frequency.

A dielectric layer 218 is disposed over the ILD layer 212 and over the contact structures 216. The dielectric layer 218 may or may not have the same dielectric material as the dielectric layer 214. The dielectric layer 218 may include silicon carbonitride, silicon nitride, silicon carbide or any suitable dielectric material having any suitable thickness. In one embodiment of the disclosure, the dielectric layer 218 has a thickness ranging from about 4 nm.

Figure 2B:
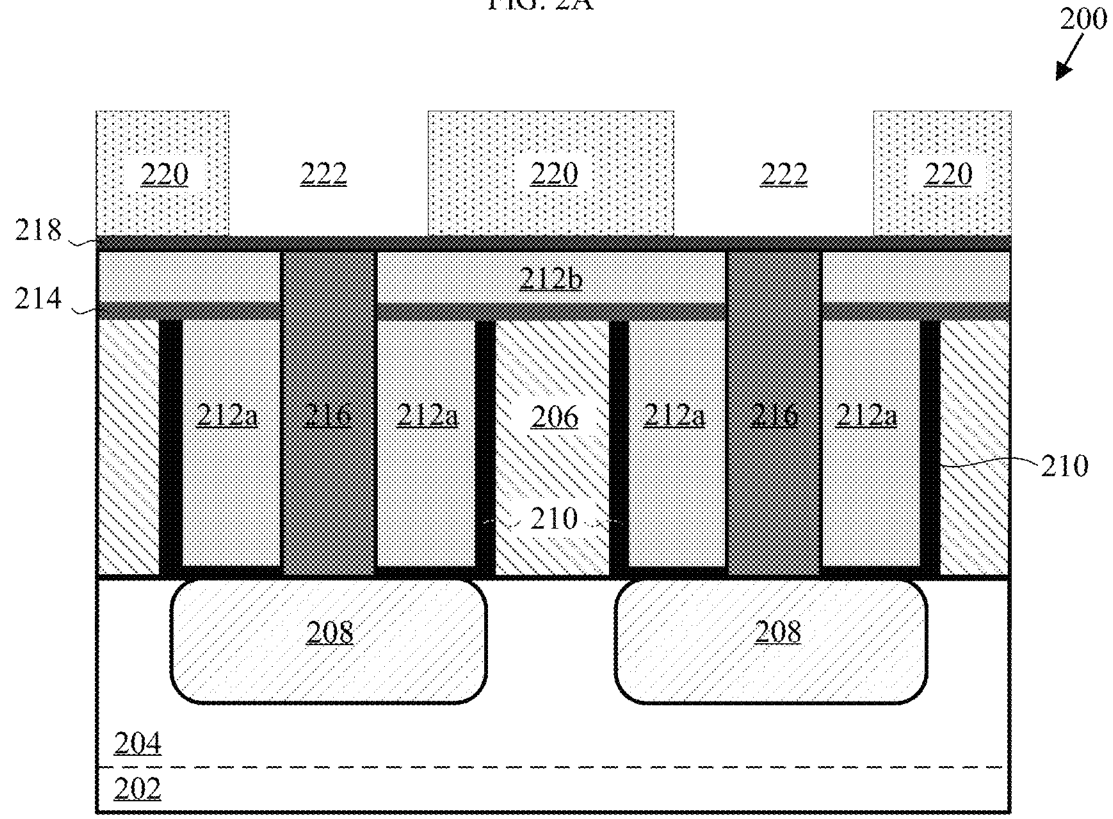

FIG. 2B illustrates the semiconductor device 200 after depositing a patterning layer 220 and forming openings 222 in the patterning layer 220, according to an embodiment of the disclosure. The patterning layer 220 is deposited over the dielectric layer 218 using a suitable deposition process. The patterning layer 220 may include a spin-on hard mask (SOH) layer, a photoresist layer, or any suitable patterning layer having any suitable thickness. The patterning layer 220 may also include a multi-layer stack of patterning materials. The openings 222 are formed in the patterning layer 220 using a suitable lithographic process. The openings 222 are aligned over the contact structures 216 and the openings 222 have a width wider than the width of the contact structures 216. Portions of the dielectric layer 218 are exposed in the openings 222.

Figure 2C:
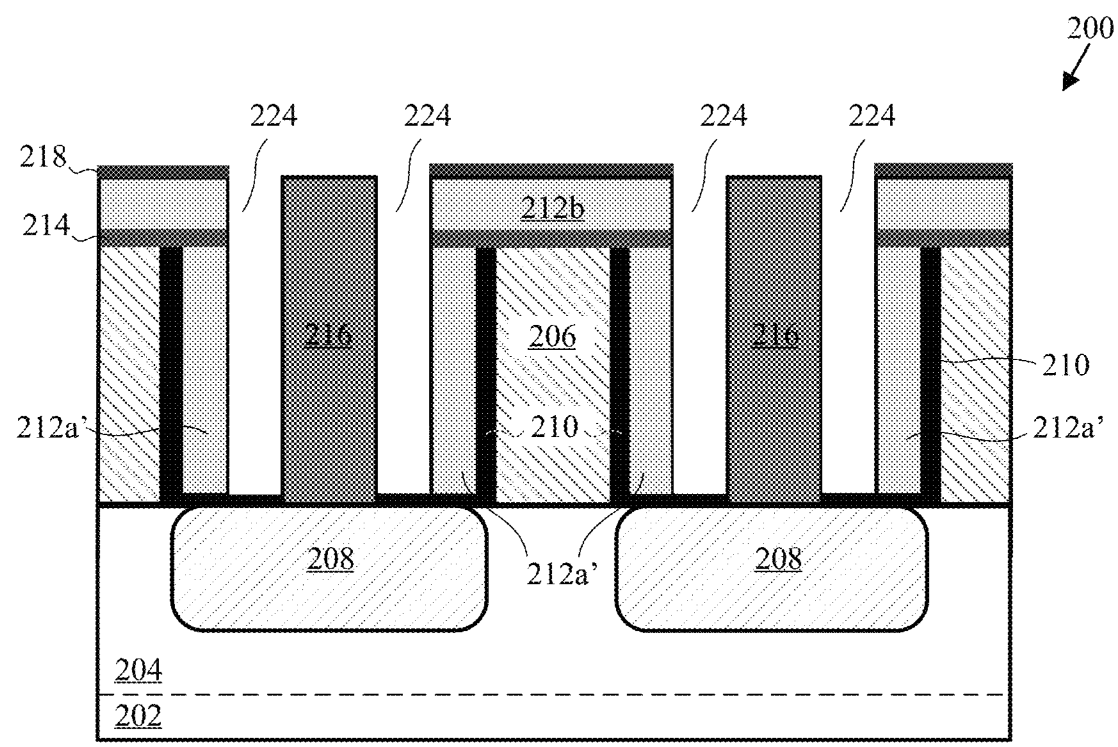

FIG. 2C illustrates the semiconductor device 200 after forming trenches 224, according to an embodiment of the disclosure. The trenches 224 are formed in the ILD layer 212 by extending the openings 222 through the dielectric layer 218 and the dielectric layer 214 to the dielectric liner 210 on the top surface of the semiconductor structures 208, using a suitable material removing process. The trenches 224 are preferably formed closer to the contact structures 216 than to the gate structures 206. In this embodiment of the disclosure, the trenches 224 adjoin and expose sidewalls of the contact structures 216, as well as also exposing portions of the dielectric liner 210 on the top surface of the semiconductor structures 208 and the remaining first portions of the ILD layer 212_a_ adjacent to the gate structures 206.

The remaining first portions of the ILD layer 212_a_ form gate dielectric sidewalls 212_a_'. The gate dielectric sidewalls 212_a_' are adjacent to the gate structures 206 and provide additional protection benefit to the gate structures 206 by preventing potential damage from the material removing process during formation of the trenches 224. The integrity of gate structures 206 is, thereby, advantageously maintained. In one embodiment of the disclosure, the trenches 224 have a width ranging from about 5 nm to 15 nm. Portions of the dielectric layer 218 over the contact structures 216 may be consequently removed during the material removing process.

Due to a difference in material properties between dielectric materials, i.e., the ILD layer 212, the dielectric layer 218 and the dielectric layer 214, and the conductive material of the contact structures 216, a substantially high etching selectivity can be obtained between them such that the contact structures 216 remain substantially intact during the material removing process operation to form the trenches 224. In this embodiment of the disclosure, the material removing process is preferably a reactive ion etching (RIE) process.

The dielectric liner 210 over semiconductor structures 208 may or may not be removed during the material removing process. In this embodiment of the disclosure, it is preferable to retain at least a portion of the dielectric liner 210 over semiconductor structures 208. The dielectric liner 210 advantageously forms a protective layer over the semiconductor structures 208 to prevent potential oxidation of the semiconductor material when exposed in the trenches 224.

The semiconductor device 200 may be subjected to a suitable cleaning process to remove potential contaminants after the material removing process. The cleaning process may be performed using a variety of etchants or cleaning agents, such as dilute sulfuric peroxide (DSP) mixture.

Figure 2D:
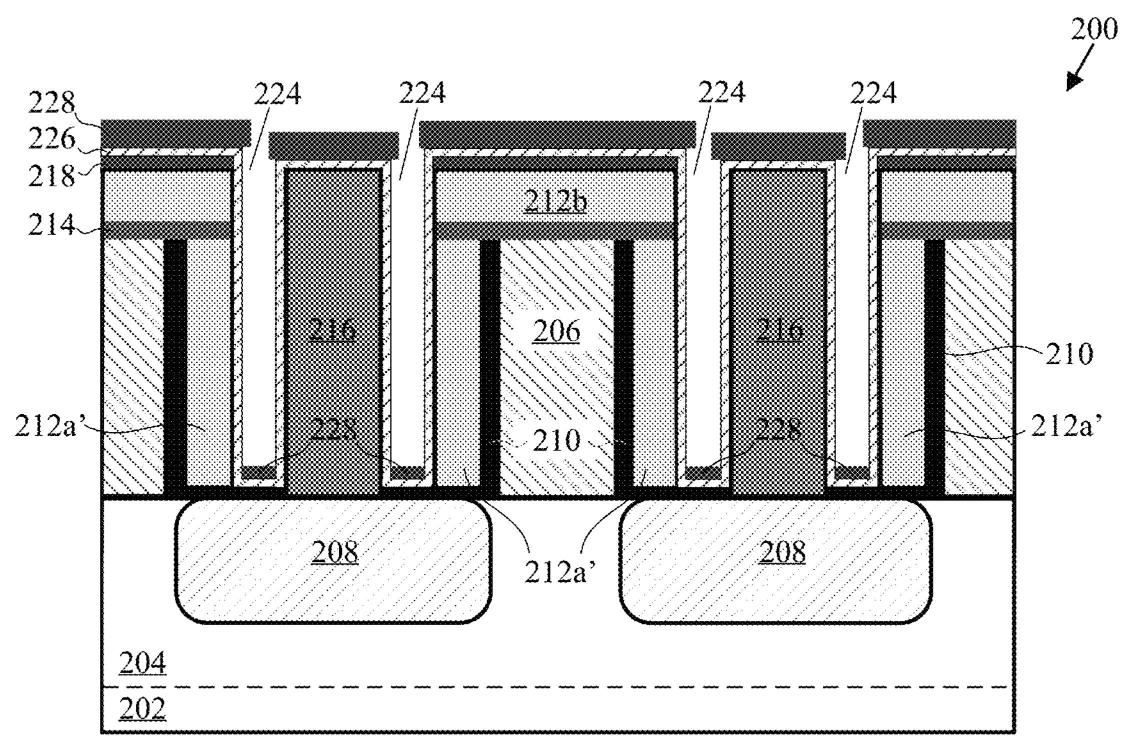

FIG. 2D illustrates the semiconductor device 200 after depositing a barrier liner 226 and a dielectric layer 228, according to an embodiment of the disclosure. The barrier liner 226 is deposited over the dielectric layer 218 and in the trenches 224, using a suitable deposition process. The deposition process is preferably a conformal deposition process such as an atomic layer deposition (ALD) process. The barrier liner 226 conformally lines the trenches 224 and leaves the trenches 224 substantially unfilled. The barrier liner 226 is preferably a dielectric liner suitable to prevent contaminants, e.g., moisture, from entering and degrading the integrity of the contact structures 216 and the ILD layer 212. The barrier liner 226 may include silicon carbonitride, silicon nitride, silicon carbide or any suitable dielectric material having any suitable thickness. In one embodiment of the disclosure, the barrier liner 226 is preferably silicon nitride having a thickness of about 1 nm.

The dielectric layer 228 is deposited over the barrier liner 226 using a suitable deposition process. The deposition process is preferably a non-conformal deposition process such as a chemical vapor deposition (CVD) process. Due to the inherent nature of a non-conformal deposition process, the dielectric layer 228 may form overhangs protruding at upper corners of the trenches 224. As illustrated in FIG. 2D, there may be small amounts of the dielectric layer 228 deposited in the trenches 224, according to some embodiments of the disclosure. The dielectric layer 228 may include silicon carbonitride, silicon nitride, silicon carbide or any suitable dielectric material having any suitable thickness. In one embodiment of the disclosure, the dielectric layer 228 is preferably silicon carbonitride having a thickness of about 5 nm.

Figure 2E:
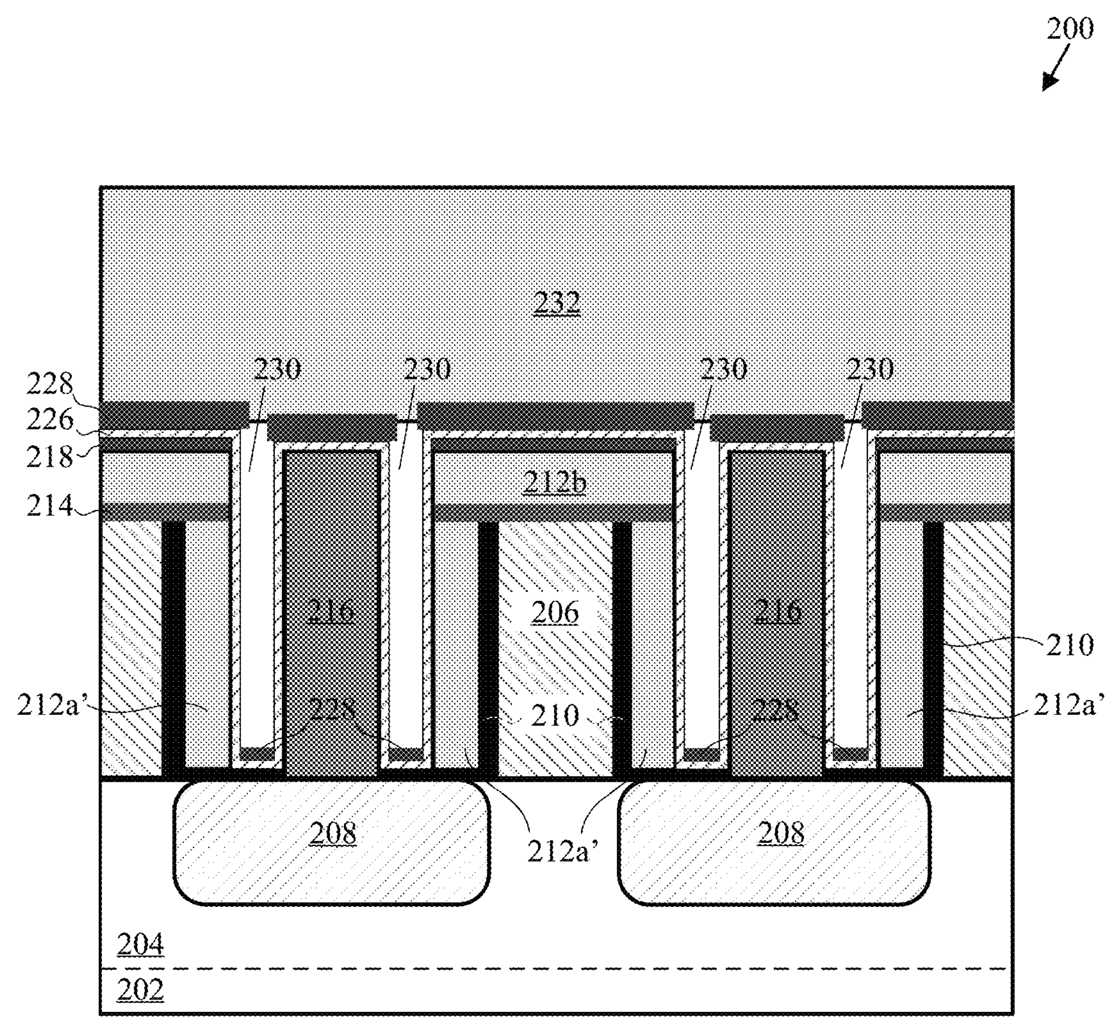

FIG. 2E illustrates the semiconductor device 200 after forming air gap regions 230, according to an embodiment of the disclosure. An ILD layer 232 is deposited over the dielectric layer 228 using a suitable deposition process. The deposition process is preferably a non-conformal deposition process such as a CVD process. The ILD layer 232 is preferably a low-k dielectric material, e.g., silicon dioxide or TEOS, suitable to electrically isolate conductive structures ultimately formed therein, while maintaining a robust structure during subsequent processing steps. The ILD layer 232 abridges the gaps between the dielectric layer 228 over the trenches 224 (not shown) and seals them, forming the air gap regions 230 adjacent to the contact structures 216. In one embodiment of the disclosure, the air gap regions 230 have a width ranging from about 5 nm to about 15 nm. In another embodiment of the disclosure, the width of the gate dielectric sidewall 212*a*' to the width of the air gap region 230 has a ratio ranging from about 0.6 to about 4.

Although referred to as "air" gap regions in this present disclosure, the elemental composition of the air can include different gases and should not be construed as having any particular elemental composition. In accordance with the present disclosure, the air gap regions are voids where no solid material is present. Any number and type of gases may be present in the air gap regions.

It is advantageous to incorporate air gap regions into a semiconductor device, especially an RF FET device. Air has a relative low dielectric constant of about 1.0, the lowest dielectric constant possible. Incorporating air gap regions into an RF FET device is an attractive method to reduce associated parasitic capacitance in the RF FET device. An overall reduction in the parasitic components, i.e., capacitance and resistance, of the RF devices will boost and improve the performances of the RF devices tremendously. Performance improvements to mmWave devices are expected to be more significant due to its extremely high operating frequency.

It is understood that the semiconductor device 200 may undergo further processing to form various semiconductor features known in the art. For example, gate contacts may be formed in the dielectric layer 232 to electrically connect the gate structures 206 to other regions of the semiconductor device 200, e.g., back-end-of-line (BEOL) region of the semiconductor device 200. The BEOL region typically includes a plurality of conductive lines and interconnect vias that are routed as needed across the semiconductor device 200.

Figure 3:
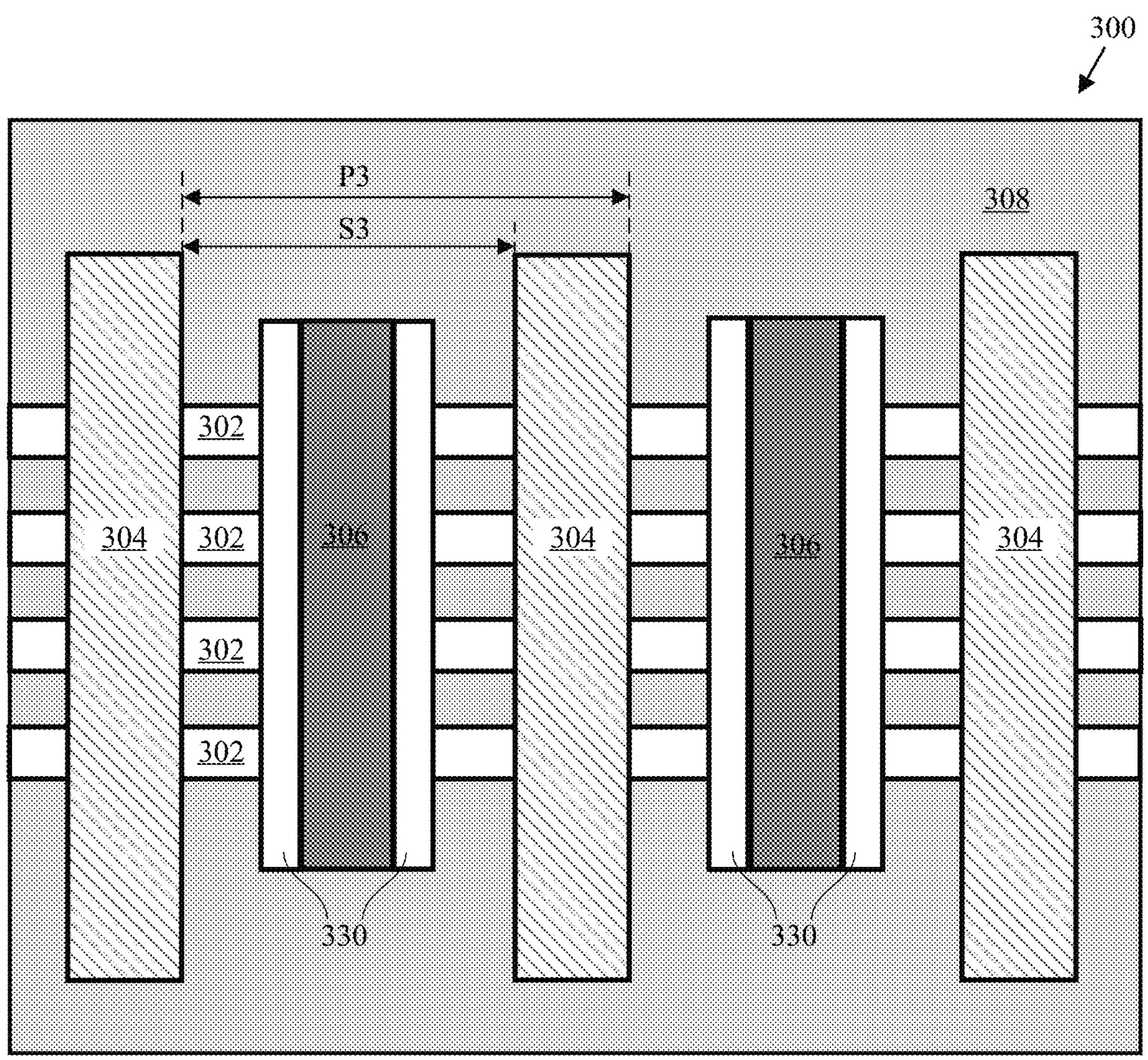
FIG. 3 is a simplified top view of a semiconductor device having air gap regions, according to an embodiment of the disclosure.

FIG. 3 is a simplified top view of a semiconductor device 300 having air gap regions 330, according to an embodiment of the disclosure. The semiconductor device 300 includes an array of active regions 302, an array of gate structure 304 and an array of contact structures 306. The array of active regions 302 is interposed between an insulative layer 308. The insulative layer 308 isolates the active regions 302 from adjacent active regions 302. Semiconductor structures (not shown) are formed in the active regions 302 between the gate structures 304. The array of gate structures 304 and an array of contact structures 306 are formed traversing across the array of active regions 302, each contact structure 306 is positioned over the semiconductor structures between two gate structures 304. The array of gate structures 304 is separated by a gate pitch P3 with a corresponding gate-to-gate spacing S3 between adjacent gate structures 304. In this embodiment, the gate pitch P3 is preferably having a width wider than 1×CPP of the semiconductor device 300.

The air gap regions 330 are formed between the gate structures 304 and the contact structures 306. The air gap regions 330 are formed over the semiconductor structures (not shown) and are positioned closer to the contact structures 306 than to the gate structures 304. More specifically, the air gap regions 330 are formed adjacent to laterally opposite sides of the contact structures 306 in a lengthwise direction. As used herein, the term "lengthwise direction" is a direction along which an object extends the most.

Figure 4:
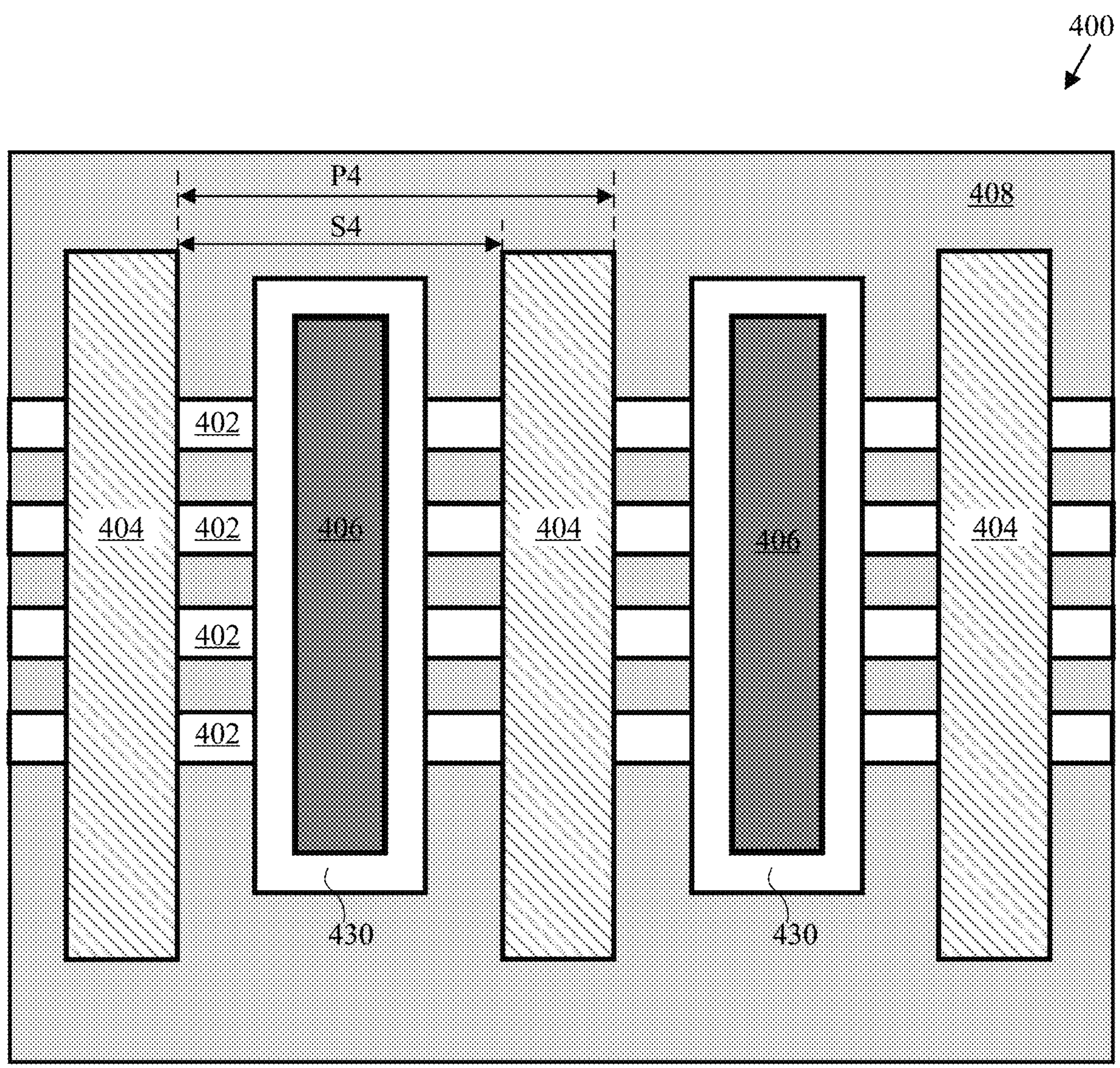
FIG. 4 is a simplified top view of a semiconductor device having air gap regions, according to an embodiment of the disclosure.

FIG. 4 is a simplified top view of a semiconductor device 400 having air gap regions 430, according to an alternative embodiment of the disclosure. The semiconductor device 400 includes an array of active regions 402, an array of gate structure 404 and an array of contact structures 406. The array of active regions 402 is interposed between an insulative layer 408. The insulative layer 408 isolates the active regions 402 from adjacent active regions 402. Semiconductor structures (not shown) are formed in the active regions 402 between the gate structures 404. The array of gate structures 404 and an array of contact structures 406 are formed traversing across the array of active regions 402, each contact structure 406 is positioned over the semiconductor structures between two gate structures 304. The array of gate structures 404 is separated by a gate pitch P4 with a corresponding gate-to-gate spacing S4 between adjacent gate structures 304. In this embodiment, the gate pitch P4 is preferably having a width wider than 1×CPP of the semiconductor device 400.

The air gap regions 430 are formed peripherally surrounding the contact structures 406. The air gap regions 430 are formed over the semiconductor structures (not shown) and are positioned closer to the contact structures 406 than to the gate structures 404. More specifically, the air gap regions 430 are formed adjacent to the contact structures 406, surrounding an outer perimeter of the contact structures 406 in a lengthwise direction and a widthwise direction, which further isolates the gate structures to reduce associated parasitic capacitance. As used herein, the term "widthwise direction" is a direction that is perpendicular to the lengthwise direction.

In the above detailed description, a semiconductor device having air gap regions and a method of forming the air gap regions are presented. The air gap regions are positioned adjacent to contact structures of the semiconductor device, advantageously minimizing the parasitic capacitance of the semiconductor devices while maintaining the integrity of adjacent gate structures. To further improve the performances of the RF devices, contact structures of the RF devices are placed in a wide gate pitch region, allowing the contact structures to have wider widths than those contact structures positioned in a 1×CPP gate pitch region. Contact structures having wider widths will gain the beneficial effect of decreased electrical resistance in the contact structures.

Overall reduction of the parasitic capacitance and the electrical resistance of the semiconductor devices are particularly advantageous for RF applications. Higher switching speed for high power RF devices with lower RF signal losses can be achieved when the semiconductor device is operating at a high frequency, especially for RF devices operating in the mmWave band.

The terms "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in one embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term "about".

While several exemplary embodiments have been presented in the above detailed description of the device, it should be appreciated that a number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:

1. A semiconductor device comprising:
- an active region over a substrate;
- a first gate structure, a second gate structure, and a contact structure over the active region;
- a first dielectric layer over a first gate structure sidewall;
- a first gate spacer between the first gate structure and the first dielectric layer;
- a second dielectric layer over a second gate structure sidewall;
- a second gate spacer between the second gate structure and the second dielectric layer;
- a first air gap region between the first dielectric layer and the contact structure;
- a second air gap region between the second dielectric layer and the contact structure; and
- a barrier liner over the first dielectric layer and a first side of the contact structure separating the first air gap region therefrom and over the second dielectric layer and a second side of the contact structure separating the second air gap region therefrom.

2. The semiconductor device of claim 1, wherein the barrier liner is silicon nitride.

3. The semiconductor device of claim 2, wherein the barrier liner has a thickness of 1 nm or less.

4. The semiconductor device of claim 1, further comprises a semiconductor structure in the active region and the contact structure is electrically connected to the semiconductor structure.

5. The semiconductor device of claim 1, further comprises a third dielectric layer over the first and second air gap regions.

6. The semiconductor device of claim 1, wherein a ratio of a width of the first dielectric layer to a width of the first air gap region ranges from 0.6 to 4.

7. The semiconductor device of claim 1, wherein the first and second air gap regions each has a width ranging from 5 nm to 15 nm.

8. A semiconductor device comprising:
- an active region over a substrate;
- an array of first gate structures having a first gate pitch and an array of second gate structures having a second gate pitch over the active region, wherein the second gate pitch is wider than the first gate pitch;
- the array of second gate structures have a first gate and a second gate;
- a plurality of semiconductor structures in the active region, wherein each semiconductor structure is positioned adjacent to the gate structures in the first and second arrays;
- the first gate having first dielectric layer and the second gate having second dielectric layer;
- a contact structure over the semiconductor structure between the first and second gates; and
- a first air gap region and a second air gap region adjacent to laterally opposite sides of the contact structure.

9. The semiconductor device of claim 8, wherein the first air gap region is positioned between the contact structure and the first dielectric layer and the second air gap region is positioned between the contact structure and the second dielectric layer.

10. The semiconductor device of claim 8, further comprises a barrier liner over the contact structure separating the first and second air gap regions from the contact structure.

11. The semiconductor device of claim 10, wherein the barrier liner is silicon nitride.

12. The semiconductor device of claim 8, wherein the first gate pitch of the array of first gate structures is a minimum gate pitch of the semiconductor device.

* * * * *